United States Patent
He et al.

(10) Patent No.: US 11,398,606 B2
(45) Date of Patent: Jul. 26, 2022

(54) 2D HYBRID PEROVSKITE-BASED OPTOELECTRONIC MATERIAL WITH SMOOTH EXTERNAL SURFACE

(71) Applicant: KING ABDULLAH UNIVERSITY OF SCIENCE AND TECHNOLOGY, Thuwal (SA)

(72) Inventors: Jr-Hau He, Thuwal (SA); Siu-Fung Leung, Thuwal (SA)

(73) Assignee: KING ABDULLAH UNIVERSITY OF SCIENCE AND TECHNOLOGY, Thuwal (SA)

( * ) Notice: Subject to any disclaimer, the term of this patent is extended or adjusted under 35 U.S.C. 154(b) by 317 days.

(21) Appl. No.: 16/696,218

(22) Filed: Nov. 26, 2019

(65) Prior Publication Data

US 2020/0220087 A1 Jul. 9, 2020

Related U.S. Application Data

(60) Provisional application No. 62/790,057, filed on Jan. 9, 2019.

(51) Int. Cl.
*H01L 51/00* (2006.01)
*H01L 51/42* (2006.01)
(Continued)

(52) U.S. Cl.
CPC ......... *H01L 51/0077* (2013.01); *C09K 11/06* (2013.01); *H01L 51/4213* (2013.01); *H01L 51/4286* (2013.01); *H01L 51/448* (2013.01); *H01L 51/502* (2013.01); *H01L 51/5253* (2013.01); *H01L 51/5296* (2013.01); *C09K 2211/188* (2013.01); *H01L 51/0003* (2013.01);
(Continued)

(58) Field of Classification Search
CPC ............ H01L 51/0077; H01L 51/4213; H01L 51/4286; H01L 51/448; H01L 51/502; H01L 51/5253; H01L 51/5296; H01L 51/0003; H01L 2251/301; H01L 2251/556; H01L 2251/558; H01L 51/428; H01L 51/0558; C09K 11/06; C09K 2211/188; Y02E 10/549
See application file for complete search history.

(56) References Cited

U.S. PATENT DOCUMENTS 6,150,536 A * 11/2000 Chondroudis ....... C07D 333/18
556/400

OTHER PUBLICATIONS

Chen, C.-Y., et al., "Probing Surface Band Bending of Surface-Engineered Metal Oxide Nanowires," ACS Nano, vol. 6, No. 11, Nov. 27, 2012 (Published online Oct. 24, 2012), pp. 9366-9372.
(Continued)

*Primary Examiner* — Selim U Ahmed
(74) *Attorney, Agent, or Firm* — Patent Portfolio Builders PLLC

(57) ABSTRACT

A two-dimensional (2D) hybrid perovskite based opto-electric device includes first and second 2D perovskite layers extending along a given plane; an organic layer sandwiched between the first and second 2D perovskite layers, and extending along the given plane; an external organic layer formed on the first 2D perovskite layer and configured to directly face an ambient of the opto-electric device and to extend along the given plane; and electrical pads directly formed over the external organic layer. A roughness of the external organic layer is smaller than 10 nm.

20 Claims, 13 Drawing Sheets

(51) Int. Cl.
   *H01L 51/50* (2006.01)
   *H01L 51/52* (2006.01)
   *C09K 11/06* (2006.01)
   *H01L 51/44* (2006.01)

(52) U.S. Cl.
   CPC .. *H01L 2251/301* (2013.01); *H01L 2251/556* (2013.01); *H01L 2251/558* (2013.01)

(56) References Cited

OTHER PUBLICATIONS

Kollár, M., et al., "Clean, cleaved surfaces of the photovoltaic perovskite," Scientific Reports, vol. 7, Article No. 695, 2017 (Published online Apr. 6, 2017), pp. 1-4.

Oranskaia, A., et al., "Halogen Migration in Hybrid Perovskites: The Organic Cation Matters," The Journal of Physical Chemistry Letters, vol. 9, No. 18, Sep. 6, 2018, pp. 5474-5480.

Smith, I.C., et al., "A Layered Hybrid Perovskite Solar-Cell Absorber with Enhanced Moisture Stability," Angew. Chem. Int. Ed , vol. 53, No. 42, Oct. 13, 2014 (Published online Sep. 1, 2014), pp. 11232-11235.

Tsai, H., et al., "High-efficiency two-dimensional Ruddlesden-Popper perovskite solar cells," Nature, vol. 536, Issue 7616, Aug. 18, 2016 (Published online Jul. 6, 2016), pp. 312-317 (15 pages total).

Turedi, B., et al., "Water-Induced Dimensionality Reduction in Metal-Halide Perovskites," The Journal of Physical Chemistry C, vol. 122, No. 25, Mar. 30, 2018, pp. 14128-14134.

* cited by examiner

2D HYBRID PEROVSKITE-BASED OPTOELECTRONIC MATERIAL WITH SMOOTH EXTERNAL SURFACE

CROSS-REFERENCE TO RELATED APPLICATIONS

This application claims priority to U.S. Provisional Patent Application No. 62/790,057, filed on Jan. 9, 2019, entitled "SURFACE-IMPROVED OPTICAL DEVICE BASED ON HYBRID PEROVSKITE," the disclosure of which is incorporated herein by reference in its entirety.

BACKGROUND

Technical Field

Embodiments of the subject matter disclosed herein generally relate to a two-dimensional (2D) hybrid perovskite-based optoelectronic material, and more particularly, to such a material that has at least one smooth external surface.

Discussion of the Background

Organic-inorganic hybrid perovskites have attracted increased attention in the past years due to, among others, their advantageous applications to optoelectronic devices including solar cells, lasers, light-emitting diodes, and photodetectors (PDs). Optoelectronic devices based on hybrid perovskites exhibit promising performance due to their superior optoelectronic properties such as high absorption coefficient, long carrier diffusion length, highly tunable bandgap, extraordinary nonlinear phenomena, and largely adjustable crystal sizes, from quantum dot to single crystal, up to the millimeter scale. For instance, it was found that such materials can achieve a solar conversion efficiency of over 22%, PD detectivity of over 1,014 Jones, and a photostriction as high as 1.25% based on hybrid perovskites.

In recent years, optoelectronic devices fabricated on single crystalline (SC) hybrid perovskites have also been extensively studied and the improved device performance associated with these materials is anticipated when compared to those based on polycrystalline perovskites. This is so because the SC hybrid perovskites exhibit longer carrier diffusion lengths and a lower trap density than the polycrystalline ones, and these improved features are expected to result in improved optoelectronic device performance.

Despite the remarkable progress of the optoelectronic devices based on the hybrid perovskites, there are significant problems that need to be overcome when comparing to the inorganic semiconductor counterparts such as silicon and GaAs. For example, the hybrid perovskites are well-known to suffer from moisture instability and other problems such as ion migration, halide vacancies, and interstitials, which has largely hindered their development as an alternative to silicon-based materials. This means that the hybrid perovskites, even when exhibiting better properties than the inorganic semiconductor ones, have a stability problem, i.e., they are not stable when exposed to the ambient, which is the case in many applications.

In the case of the SC hybrid perovskites, moisture from the ambient environment can lead to the hydration of the perovskite crystal surface, which likely will cause poor contact and performance loss of the optoelectronic devices that use such materials. In addition, it has been reported that the hydrated surface of the SC hybrid perovskites behaves like polycrystalline perovskites, which results in the surface having distinct optoelectronic properties then the bulk of the material. This differential behavior of the same material has been evidenced by the time-resolved photoluminescence measurements.

Thus, there is a need for an improved hybrid perovskite material that has all the advantages discussed above, but is also stable when exposed to humidity, and is not prone to ion migration, halide vacancies, and interstitials.

BRIEF SUMMARY OF THE INVENTION

According to an embodiment, there is a two-dimensional (2D) hybrid perovskite based opto-electric device that includes first and second 2D perovskite layers extending along a given plane; an organic layer sandwiched between the first and second 2D perovskite layers, and extending along the given plane; an external organic layer formed on the first 2D perovskite layer and configured to directly face an ambient of the opto-electric device and to extend along the given plane; and electrical pads directly formed over the external organic layer. A roughness of the external organic layer is smaller than 10 nm.

According to another embodiment, there is a two-dimensional (2D) hybrid perovskite material that includes a first 2D perovskite layer extending along a given plane; an organic layer extending along the first 2D perovskite layer; a second 2D perovskite layer extending along the organic layer so that the organic layer is sandwiched between the first and second 2D perovskite layers; and an external organic layer extending along the first 2D perovskite layer so that the external organic layer directly faces an ambient. A roughness of the external organic layer is smaller than 10 nm.

According to still another embodiment, there is a method for making a two-dimensional (2D) hybrid perovskite based opto-electric device, and the method includes dissolving an inorganic material into an acid to form a solution; adding an organic material to the solution to obtain a mixture; cooling down the mixture to obtain plural 2D perovskite layers extending along a given plane and plural organic layers extending along the given plane, the plural 2D perovskite layers being interleaved with the organic layers; and removing by exfoliation a set of 2D perovskite layers and organic layers from the plural 2D perovskite layers and the plural organic layers so that a most external layer is an external organic layer that directly faces an ambient of the material and extends along the given plane. A roughness of the external organic layer is smaller than 10 nm.

BRIEF DESCRIPTION OF THE DRAWINGS

For a more complete understanding of the present invention, reference is now made to the following descriptions taken in conjunction with the accompanying drawings, in which.

DETAILED DESCRIPTION OF THE INVENTION

Figure 1:
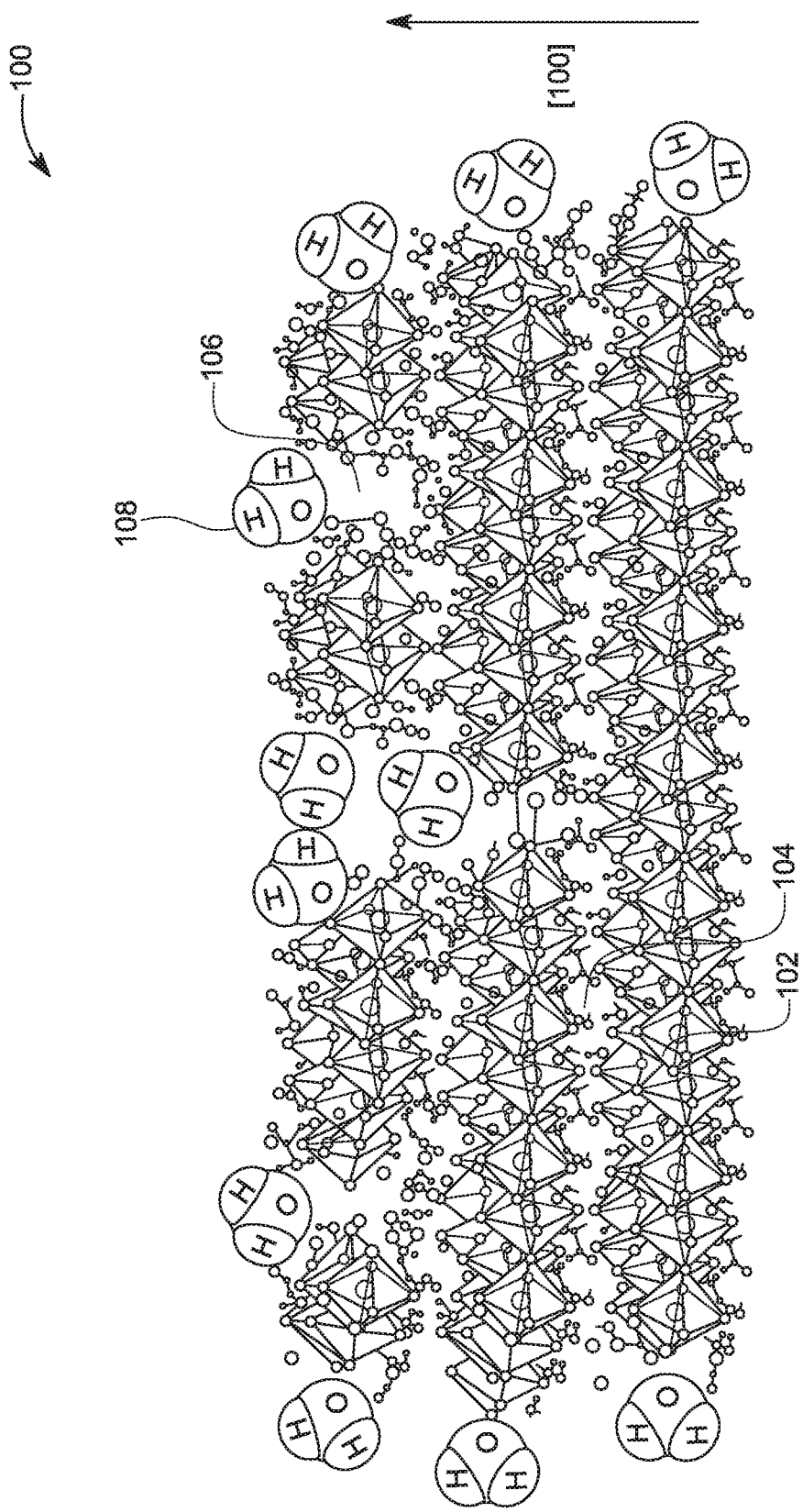
FIG. 1 illustrates a rough-surface 2D hybrid perovskite material.

The following description of the embodiments refers to the accompanying drawings. The same reference numbers in different drawings identify the same or similar elements. The following detailed description does not limit the invention. Instead, the scope of the invention is defined by the appended claims. The following embodiments are discussed, for simplicity, with regard to an optoelectronic device that uses a specific hybrid perovskite material, in which the organic layers are made of ethanolamine (EA) and the inorganic layers are made of $PbI_4$. However, the embodiments to be discussed next are not limited to such a specific hybrid perovskite material but may be used with other organic and/or inorganic materials.

Reference throughout the specification to "one embodiment" or "an embodiment" means that a particular feature, structure or characteristic described in connection with an embodiment is included in at least one embodiment of the subject matter disclosed. Thus, the appearance of the phrases "in one embodiment" or "in an embodiment" in various places throughout the specification is not necessarily referring to the same embodiment. Further, the particular features, structures or characteristics may be combined in any suitable manner in one or more embodiments.

Because the perovskite materials are promising for the optoelectronic field, and because of their limitations discussed in the Background section, there is a need to adapt or to improve these materials to overcome these limitations. The 2D hybrid perovskite materials have surface properties that are not currently fully explored and understood and it is believed that understanding the effect of the surface condition of the hybrid perovskites on their optoelectronic properties and the device performance is the way for improving these materials [1,2]. The utilization of 2D layered perovskites with bonding organic layers is a promising approach to mitigate the moisture stability issue [3, 4, 5]. Because the organic layers can slow down the penetration of the moisture into the perovskite layers, the optoelectronic devices fabricated based on 2D perovskites with organic layers exhibit improved stability to moisture.

Moreover, due to the weak Van der Waals force between the functional organic groups of the organic layers, the 2D layered perovskites can be mechanically exfoliated, which result in an extremely smooth and clean external surface. It is expected that the optoelectronic properties and device performance on the cleaved perovskite, which has a smooth and clean surface, will be different from the perovskites with a rough surface [6]. Thus, the relationship between the surface condition of the 2D layered perovskites and their optoelectronic properties is now investigated.

According to an embodiment, a novel optoelectronic device includes 2D hybrid perovskite crystals having a smooth external surface. The smooth external surface is shown to reduce the moisture instability and also to mitigate the other problems currently exhibited by the existing hybrid perovskite materials. In one application, the 2D hybrid perovskite material includes EA as the organic layers and $PbI_4$ for the inorganic layers. In one application, the external surface of the 2D hybrid perovskite material has a smoothness in a sub-nanoscale range, i.e., an RMS of the roughness of the given external surface is smaller than 1 nm.

According to the embodiment illustrated in FIG. 1, the 2D hybrid perovskite material 100 includes plural inorganic layers 102 and plural organic layers 104. In this embodiment, the inorganic layers 104 are made of $PbI_4$ and the organic layers 104 are made of EA, i.e., $HOCH_2CH_2NH_3^+$. Other inorganic and organic materials may be used for these layers. In this application, a 2D hybrid perovskite material is understood to include crystalline layers 102 of the inorganic material, which extend in a two-dimensional plane, and these crystalline layers sandwich one or more organic layers 104. Because of the crystalline structure of the inorganic layers 102 and because these layers extend in a 2D plane, the entire material 100 is considered to be 2D, i.e., it includes plural 2D inorganic layers bound together by the interleaved organic layers.

FIG. 1 shows that especially the outer inorganic layers have defects 106, which in this case is a gap. Other type of defects may be present. If the defects 106 are gaps, then water molecules 108 may enter into these defects and negatively alter the structure and the properties of the 2D hybrid perovskite material 100, as discussed above.

Figure 2:
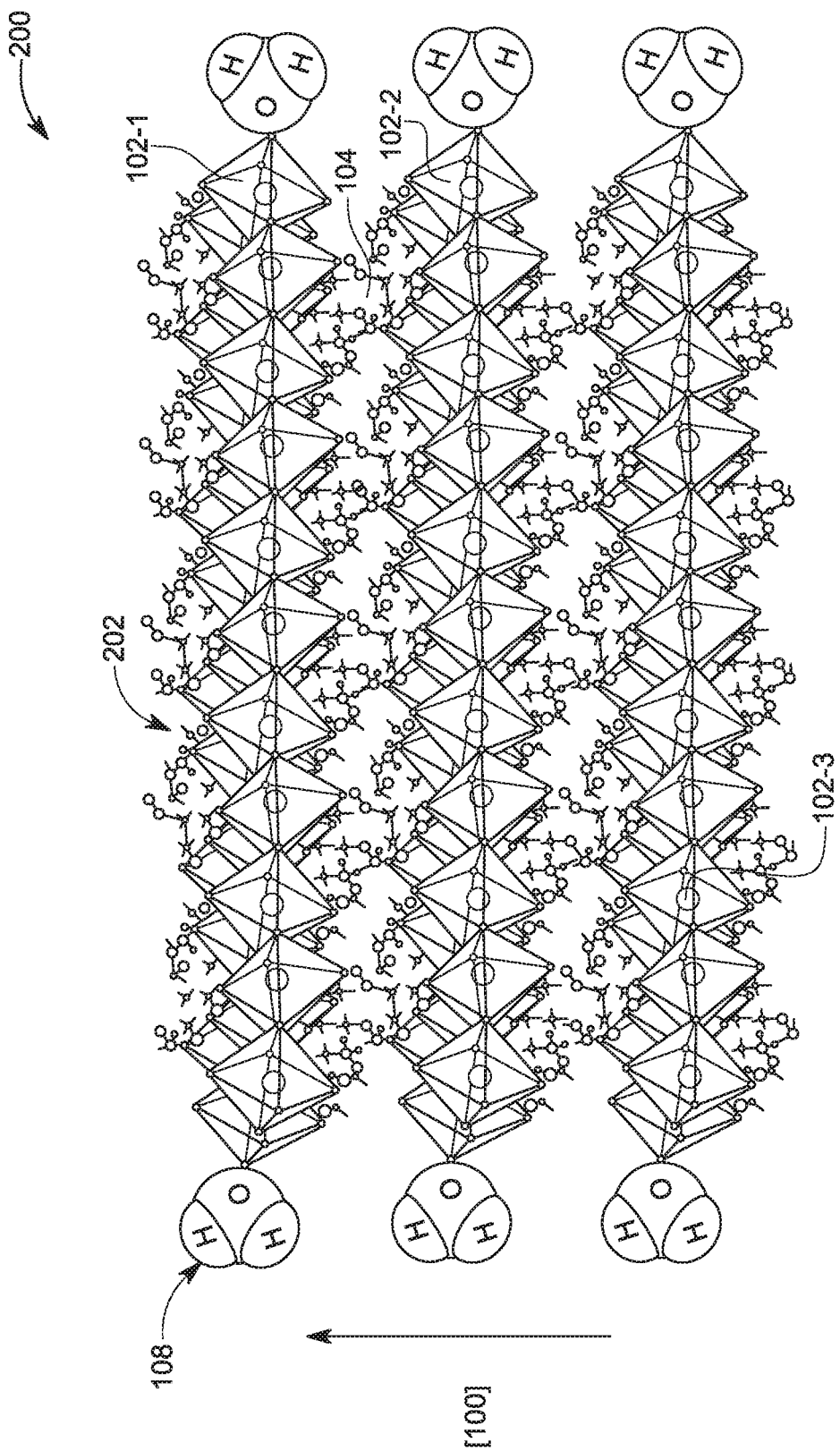
FIG. 2 illustrates a smooth-surface 2D hybrid perovskite material.

The inventors have discovered that if these defects in the external layers of the 2D hybrid perovskite material are removed, the moisture would be prevented from entering the material, and thus the properties of this material would not be negatively be affected by the ambient. Thus, the inventors have processed (e.g., by exfoliation) the 2D hybrid perovskite material to remove one or more external perovskite layers and associated organic layers so that the processed 2D hybrid perovskite material 200, which is shown in FIG. 2, has a reduced number of defects in the external layer 202. Note that the exfoliation process is performed so that the material has a surface that corresponds to the (100) crystallographic plane.

FIG. 2 shows a first perovskite layer 102-1 left after a set of perovskite layers and organic layers have been removed by the exfoliation process. The set may include any number of layers. FIG. 2 also shows the organic layer 104, a second perovskite layer 101-2, and so on. FIG. 2 shows that the most external organic layer 202 has no defect, which is also true for the most external perovskite layer 102-1. Note that the most external organic layer 202 is facing directly the ambient and thus, the moisture from the ambient is firstly interacting with this layer. This means that the other layers of perovskite and organic material are shielded from the ambient by this most external organic layer.

The exfoliation process applied to the rough-surface 2D hybrid perovskite material 100 for obtaining the smooth-surface 2D hybrid perovskite material 200 may remove less than all the defects. While FIG. 2 shows plural perovskite layers and plural organic layers having no defects, it is possible to still have some defects in the external layers. After removing by exfoliation the plural layers, in one application it is possible to have only two perovskite layers 102-1 and 102-2 left, which sandwich a single organic layer 104. For this specific hybrid perovskite material 200, the most external organic layer 202 has a minimal number of defects. However, to obtain the most external organic layer 202 having almost no defects, the exfoliation process needs to remove those layers that are plagued by defects. Thus, it is a matter of how many layers are removed from the rough-surface hybrid perovskite material 100 to obtain the smooth-surface 2D hybrid perovskite material 200.

Figure 3A:
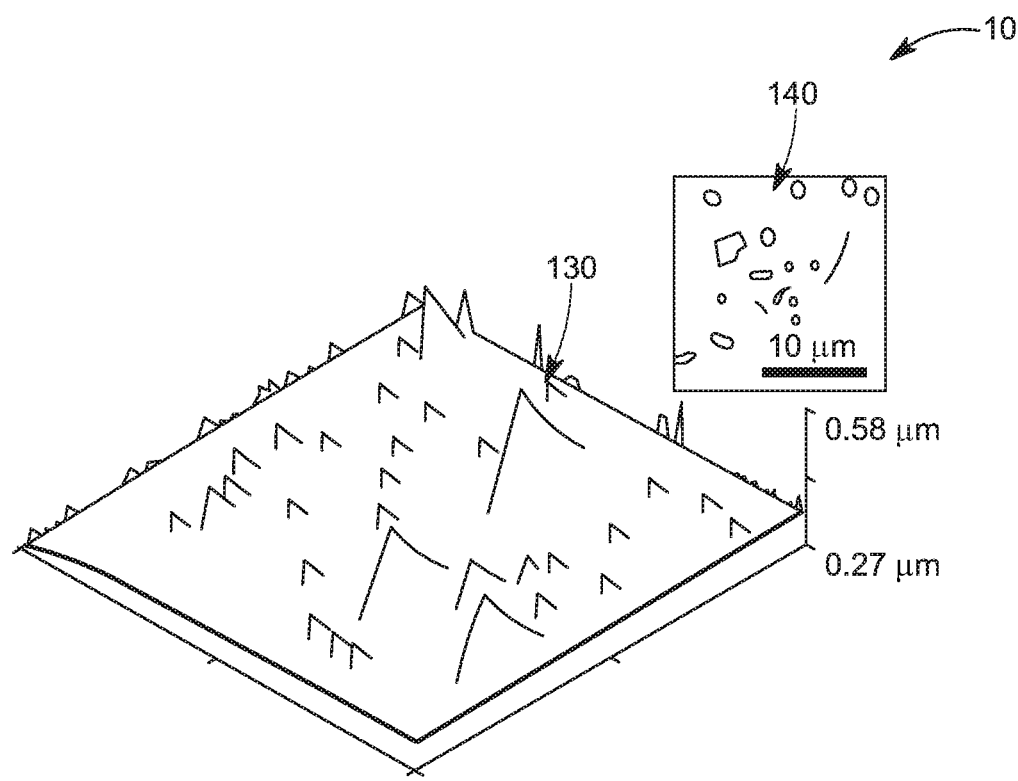
FIG. 3A illustrates a roughness of the rough-surface 2D hybrid perovskite material and FIG. 3B illustrates a roughness of the smooth-surface 2D hybrid perovskite material.
Figure 3B:
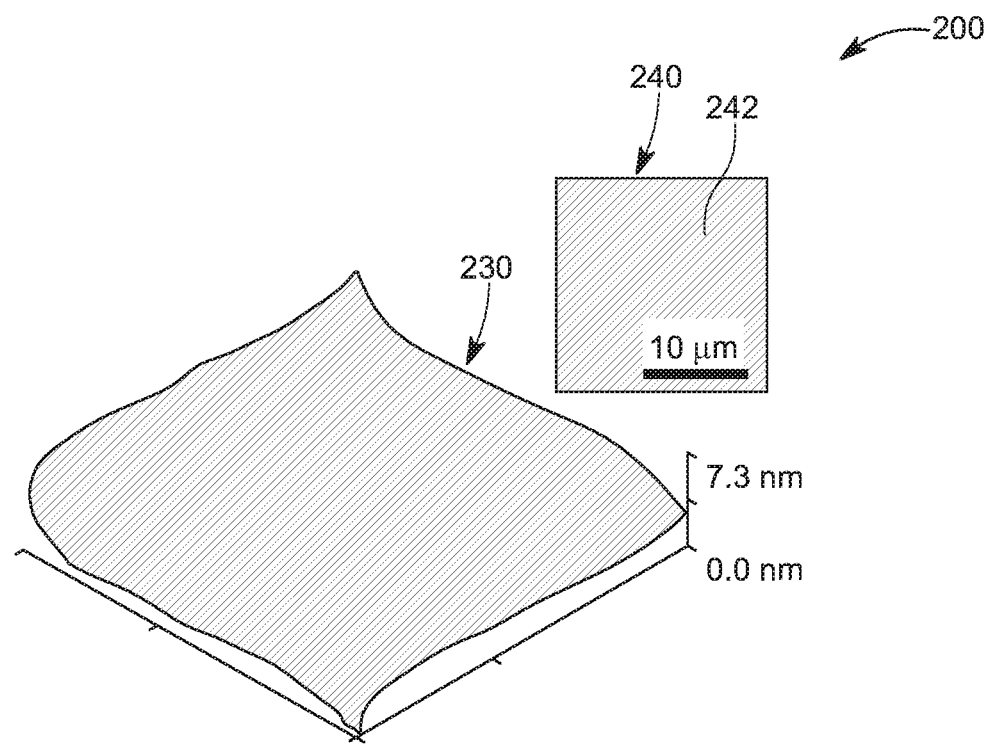

In one application, it is possible to quantify the amount of defects that are removed, or are left, by the exfoliation process in terms of the roughness of the external layer 202. In this regard, FIG. 3A illustrates an atomic force microscopy (AFM) picture of the rough-surface 2D hybrid perovskite material 100 while FIG. 3B illustrates the AFM picture of the smooth-surface 2D hybrid perovskite material 200. More specifically, the RMS roughness of the material 100 in FIG. 3A was calculated to be 15.94 nm while the RMS roughness of the material 200 n FIG. 3B was calculated to be 0.72 nm. Note that the RMS roughness for FIG. 3A is calculated as the root means square of various heights $y_i$ of n points (point 130 is a peak) for a given path or area. Thus, the roughness profile contains n ordered, equally spaced points along a path or trace, and $y_i$ is the vertical distance from a mean line to the $i^{th}$ data point. Height is assumed to be positive in the up direction, away from the bulk material. The height of the peak 130 is around 580 nm while the height of the peak 230 in FIG. 3B is only about 7.3 nm. The inset of FIG. 3A shows a detail 140 of the outer layer of the material 100, which when compared to the detail 240 of the layer 202 of the inset of FIG. 3B, is very rough.

The inset of FIG. 3A shows the high-magnification optical microscopy image of an as-grown 2D perovskite crystal in which many defects can be seen. After exfoliation, a fresh (100) surface of the 2D perovskite is exposed, as shown by the inset of FIG. 3B. The entire surface 242 of the cleaved 2D hybrid perovskite material 200 shown in the inset of FIG. 3B is a relatively continuous single layer, which is extremely clean and smooth and this organic layer can prevent the penetration of moisture into the inner perovskite layers. As will be discussed later, it was found that the as-grown hybrid perovskite 100 and the cleaved hybrid perovskite material 200 have the same bulk crystal structure, demonstrating that they have identical intrinsic material properties, so that the differences in their optoelectronic properties are caused by the surface condition of the smooth-surface 2D hybrid perovskite crystals.

In the following, a material is considered to be smooth when an external surface of the material has a RMS roughness in the sub-nano range, i.e., less than 1 nm. In one application, the material is considered to be smooth when the RMS roughness is below 5 nm. In still another application, the material is considered to be smooth when the RMS roughness is below 10 nm.

The smooth surface of the material 200 may be obtained through exfoliation. This term is understood herein to include mechanical exfoliation, chemical exfoliation or other types of exfoliation as, for example, laser assisted exfoliation, surfactant-assisted exfoliation, etc. The 2D layered hybrid perovskite material 200 can be mechanically exfoliated due to the weak Van der Waals forces between the organic linker.

Figure 4:
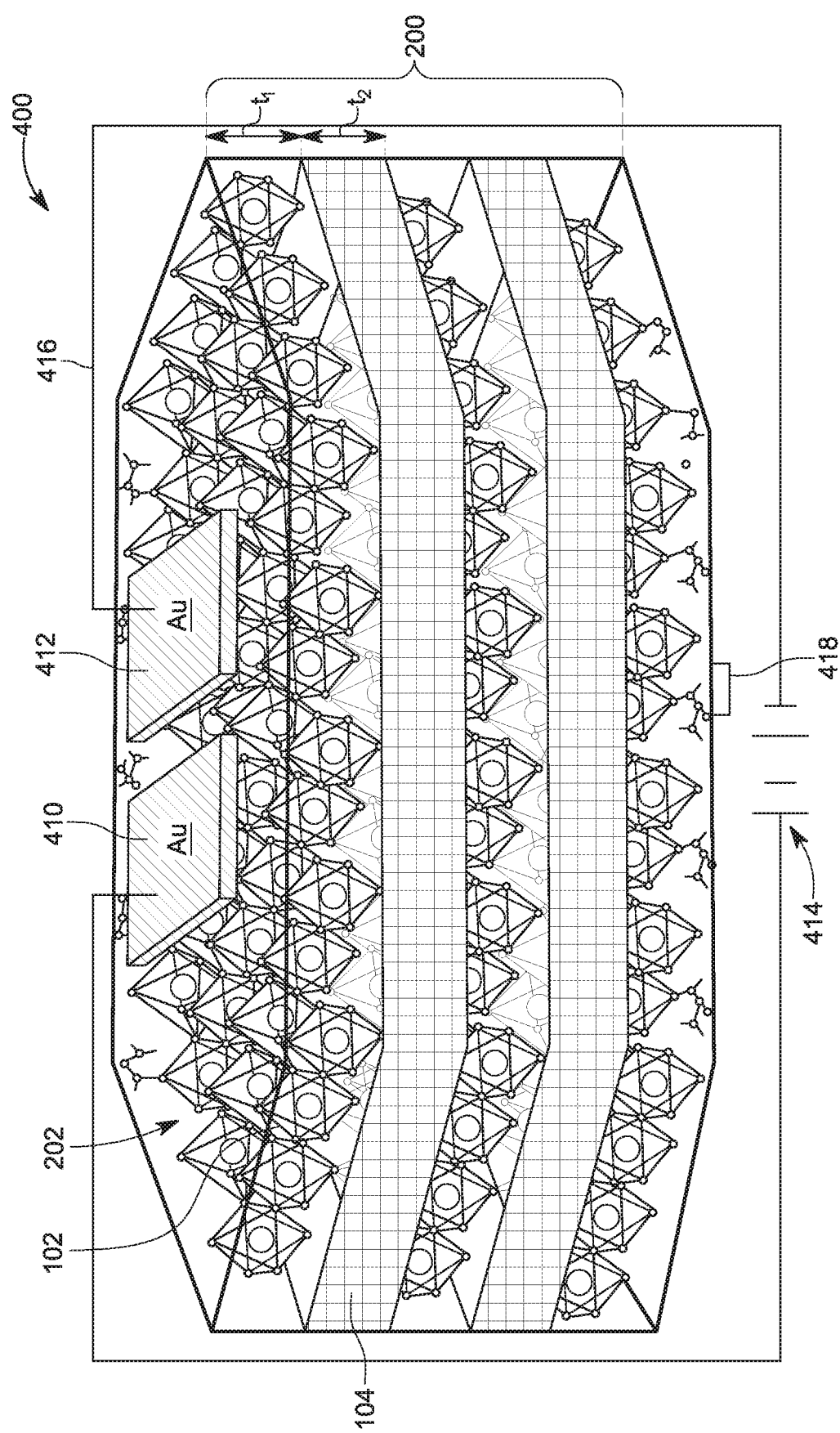
FIG. 4 illustrates an opto-electronic device that uses the smooth-surface 2D hybrid perovskite material.

To examine the surface smoothness effect, a metal-semiconductor-metal (MSM) device 400 was fabricated as illustrated in FIG. 4. The MSM device 400 has a smooth external surface 202 due to the exfoliation of the 2D hybrid perovskite material 200. Two electrodes 410 and 412 (for example, made of gold) were deposited on the smooth surface 202 and a voltage source 414 was connected to the two electrodes via wires 416. If the voltage source 414 applies a certain voltage, the 2D hybrid perovskite material 200 may act as a light emitting device. If the 2D hybrid perovskite material 200 is exposed to light and the voltage source 414 is replaced with a voltage measurement device or an energy storage device, then the device 400 acts as a light detector that transforms light energy into electrical energy. The same configuration may be used to achieve a solar cell. Alternatively, it is possible to add a third electrode 418, on a side that is opposite to the two electrodes 410 and 412, and to use the device 400 as a transistor. If the transistor 400 is exposed to light, it may function as a phototransistor.

Similarly, a MSM device (not shown) was formed based on the rough-surface 2D hybrid perovskite material 100 having the rough surface with defects 106 and the two devices' optoelectronic properties were investigated in various environments, including an ambient with a relative humidity of over 50%. It was found, as discussed next, that the smooth-surface 2D hybrid perovskite material 200 is less sensitive to the ambient moisture, which can cause the doping of the perovskites. As a result, the MSM device 400 exhibits a considerably low dark current, which results in an improved photodetectivity as compared with the rough-surface hybrid perovskite material 100.

The MSM device shown in FIG. 4 uses EA as the organic layer between the 2D single crystal (SC) perovskite layers, which can more effectively prevent the moisture from penetrating into the bulk of the material 200. In this embodiment, a thickness t1 of the inorganic layer 102 is around 6 Å while a thickness t2 of the organic layer 104 is about 4 Å. The MSM device 400 exhibits a better moisture stability as compared to a 2D perovskite material that uses the conventional phenylalkylammonium (PEA, $C_6H5(CH_2)_2NH_{3^+}$) as the organic layer 104. This is so due to the stronger Coulomb interactions within the EA organic layer 204. The better stability of the EA 2D hybrid perovskite material 200 is evidenced by the stable carrier lifetime and surface topology over time as now discussed.

Figure 5:
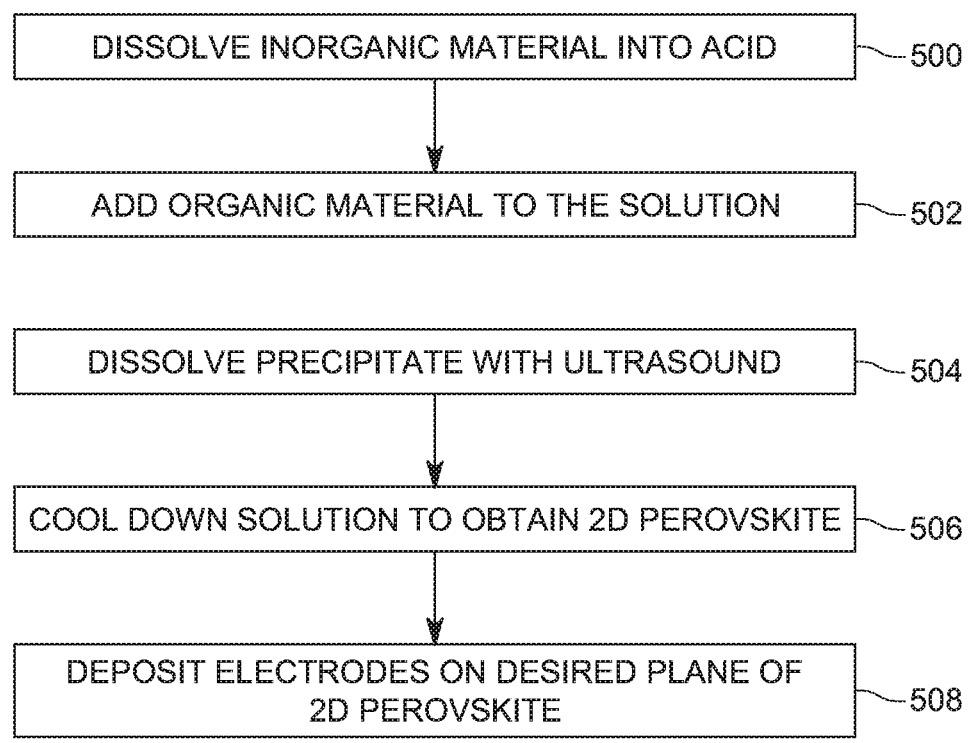
FIG. 5 is a flowchart of a method for forming a 2D hybrid perovskite material.

The device 400 is made as now discussed with regard to FIG. 5. In step 500, 0.160 g of $PbI_2$ was dissolved in 2 ml of 57% hydroiodic acid (HI), in a sample vial. In step 502, 0.080 g of $HOC_2H_4NH_2$ were added to the solution and the precipitate was dissolved in step 504 by ultrasound at room temperature. In step 506, the solution was cooled down to 4 degrees Celsius until the 2D hybrid perovskite material 200 was obtained. In step 508, two 60 nm thick gold electrodes were evaporated on a desired crystallographic plane of the material 200. In one application, the two electrodes are 500 μm wide, 60 μm thick and they are formed with a gap of 20 μm in between. The numbers in this method are exemplary and one skilled in the art will know that other concentrations and quantities for these substances may be used.

Figure 6A:
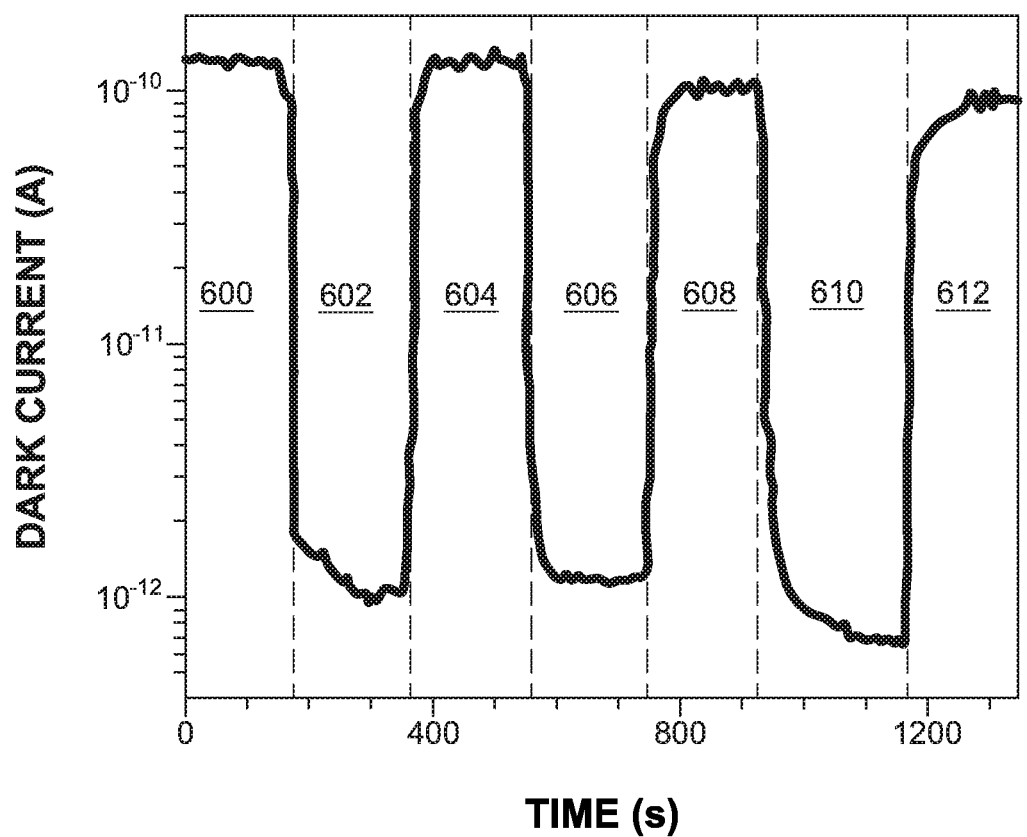
FIG. 6A illustrates the dark current for the rough-surface 2D hybrid perovskite material and FIG. 6B illustrates the dark current for the smooth-surface 2D hybrid perovskite material.
Figure 6B:
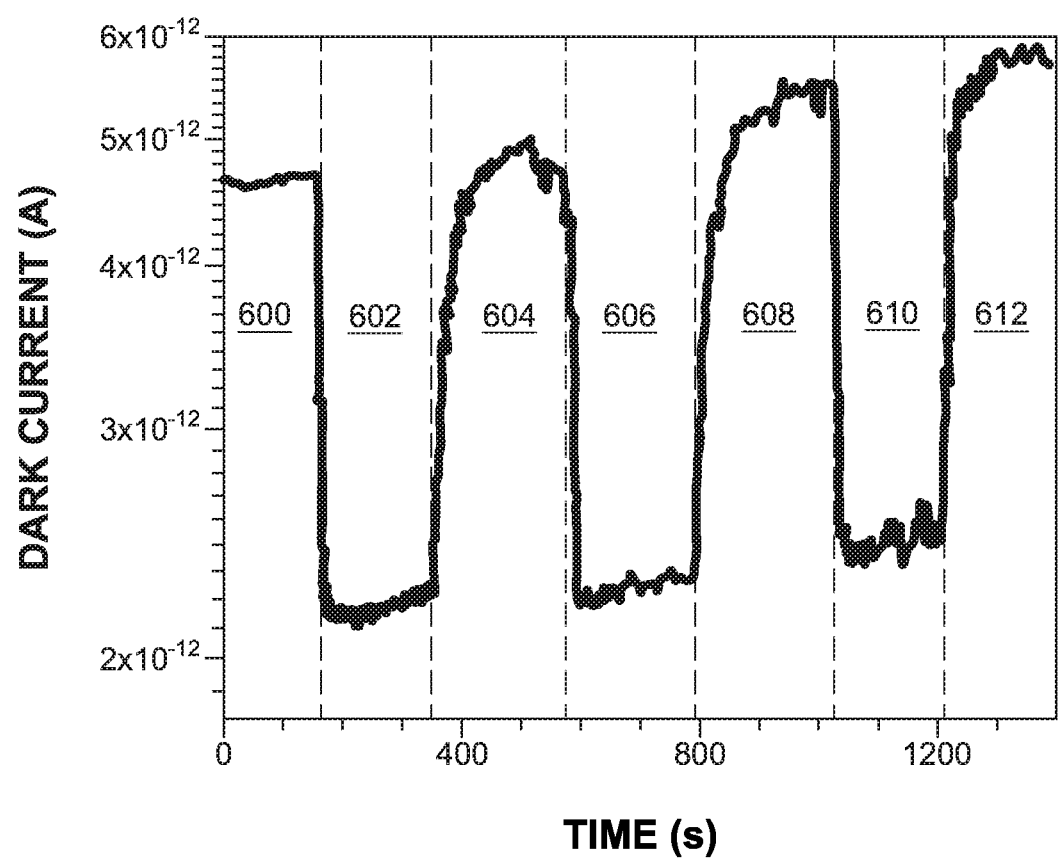

To examine the optoelectronic characteristics of the rough and smooth 2D hybrid perovskite materials 100 and 200 under various gas environments, the dark current under a 3 V bias was measured for each material under various gas environments, by flowing gases into a chamber where the materials were held. The gases were flown in the following sequence: air with 57% relative humidity (RH) 600, dry $N_2$ 602, $N_2$ with 57% RH 604, dry $O_2$ 606, $O_2$ with 57% RH 608, dry air 610, and again air with 57% RH 612. FIG. 6A shows the dark current for the rough material 100 and FIG. 6B shows the dark current for the smooth material 200 under this regimen. For the rough material 100, the dark current under moisture is about $10^{-10}$ A, which is two orders of magnitude higher than that in the dry environment, which is in the range of $10^{-12}$ A.

From FIG. 6A, it can be seen that the electrical current is only influenced by the presence of the moisture, but not by the type of gas, which implies that the moisture is the cause of the dark current increase. In addition, the dark current for both perovskite materials 100 and 200 were measured under vacuum and similar results were obtained as for the dry gases. The increase of the current in the presence of the $H_2O$ can be attributed to the electron donating (doping) from the water molecules to the perovskites, which results in the drop of the resistivity of the perovskites. It is also noted that the dark current increase due to the moisture is reversible, as the electrical current goes back to the $10^{-12}$ A range when the subsequent dry gas flows in. Therefore, FIGS. 6A and 6B present strong evidence that the influence of the moisture on the materials 100 and 200 is due to the $H_2O$ molecule absorption on the perovskite surface rather than other mechanisms, such as free ions formation by dissolving perovskites in water. The same trend that the dark current is higher in the presence of the moisture can also be observed in the case of the smooth 2D material 200 in FIG. 6B.

The dark current of the smooth 2D hybrid perovskite material 200 under moisture and without moisture is about 5 and 2 pA, respectively. The difference is apparently much smaller than for the rough perovskite material 100, which is a two orders of magnitude difference. The result is explained as the surface of the rough 2D hybrid perovskite material contains many discontinued perovskite layers, as shown in FIG. 1, which provides a large surface area for chemisorption of the $H_2O$ molecules and leads to the doping to the perovskites. On the contrary, the surface of the organic layer 202 of the smooth 2D hybrid perovskite material 200 exhibits a relatively continuous surface and thus, this layer exposes less perovskite edges to water molecules. As a result, the smooth perovskite material 200 has a much lower dark current in the ambient environment than the rough perovskite material 100, as noted when FIG. 6B is compared to FIG. 6A.

Figure 7:
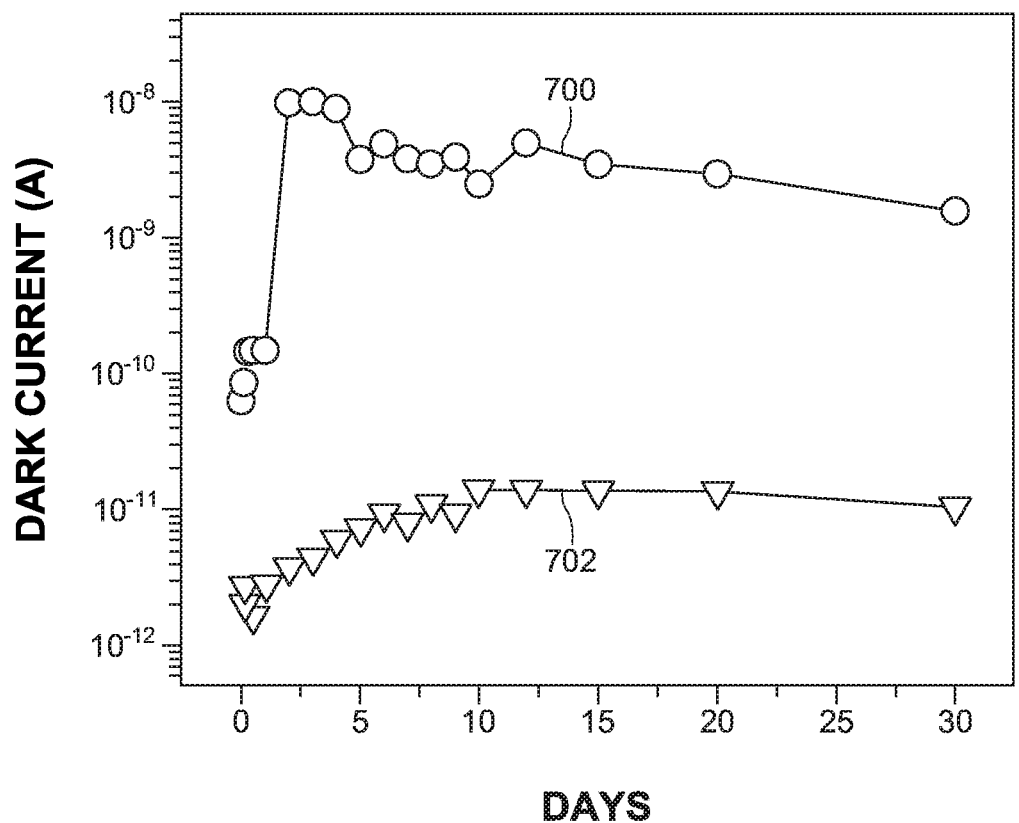
FIG. 7 illustrates the dark current for the smooth- and rough-surface 2D hybrid perovskite materials over time.

In addition, it was found that the dark current of the smooth 2D hybrid perovskite material 200 is more stable under the ambient environment over time. FIG. 7 displays the dark current 700 for the smooth 2D hybrid perovskite material 200 and the dark current 702 for the rough 2D hybrid perovskite material 100 from day 0 to day 30. For the smooth-surface hybrid perovskite material 200, the initial dark current is 5 pA. The dark current 702 increases with time due to the chemisorption of the moisture and reaches the peak of 14.1 pA on day 12. After day 12, the dark current 702 becomes stabilized and slightly reduced until day 30. In contrast, the dark current 700 of the rough-surface hybrid perovskite material 100 is 61.8 pA at day 0 and increases to 147 pA in just 1 day. The dark current 700 reaches a plateau on day 3, which is 10.0 nA, and becomes stabilized for the remaining days. The dramatic increase of the dark current 700 over time is another evidence of the stronger moisture chemisorption due to the exposed perovskite surfaces in the rough-surface hybrid perovskite material 100.

Figure 8A:
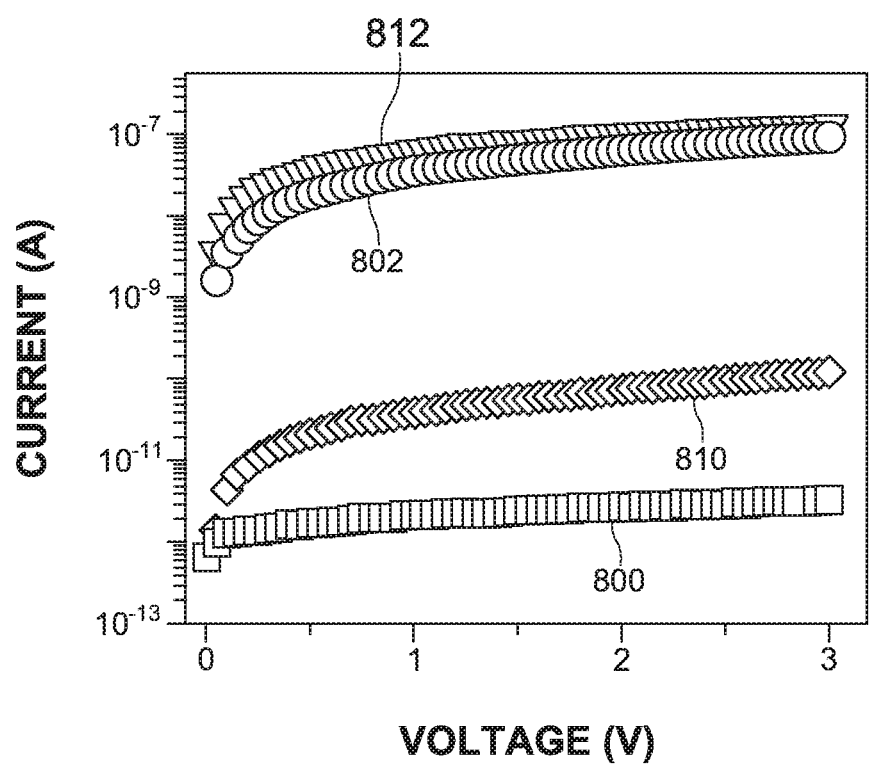
FIG. 8A illustrates the current-voltage characteristics for the smooth- and rough-surface 2D hybrid perovskite materials.

The behavior of the 2D perovskite materials 100 and 200 were also studied under optical illumination. The photocurrent of both kinds of hybrid perovskite materials were investigated under light illumination having a wavelength from 400-700 nm, under a 3 V bias. The MSM device 400 and a similar device (not shown) for the rough hybrid perovskite material 100 were used to measure the responsivity, detectivity (D*), and the linear dynamic range (LDR), to evaluate the surface effect on the optoelectronic properties of the 2D hybrid perovskite materials 100 and 200. FIG. 8A shows the I-V characteristics of the smooth and rough hybrid perovskite materials for a light intensity of 0.1 mW $cm^{-2}$ under dark conditions and when exposed to a light having a wavelength of 550 nm. Line 800 shows the current of the smooth hybrid perovskite material 200 with no light and line 802 shows the current for the same material when exposed to the light having the wavelength 550 nm. Line 810 shows the current for the rough hybrid perovskite material 100 with no light illumination and line 812 shows the current for the same material when exposed to the 550 nm light. Although these two materials behave very differently in term of the dark current, their photocurrent (curves 802 and 812) are almost the same. This phenomenon can be explained by the fact that the moisture mostly affects the surface, but not the bulk of the hybrid perovskite materials. Therefore, the absorption of the moisture has a significant influence on the dark current, but not on the photocurrent, which is governed by the intrinsic material properties.

Figure 8B:
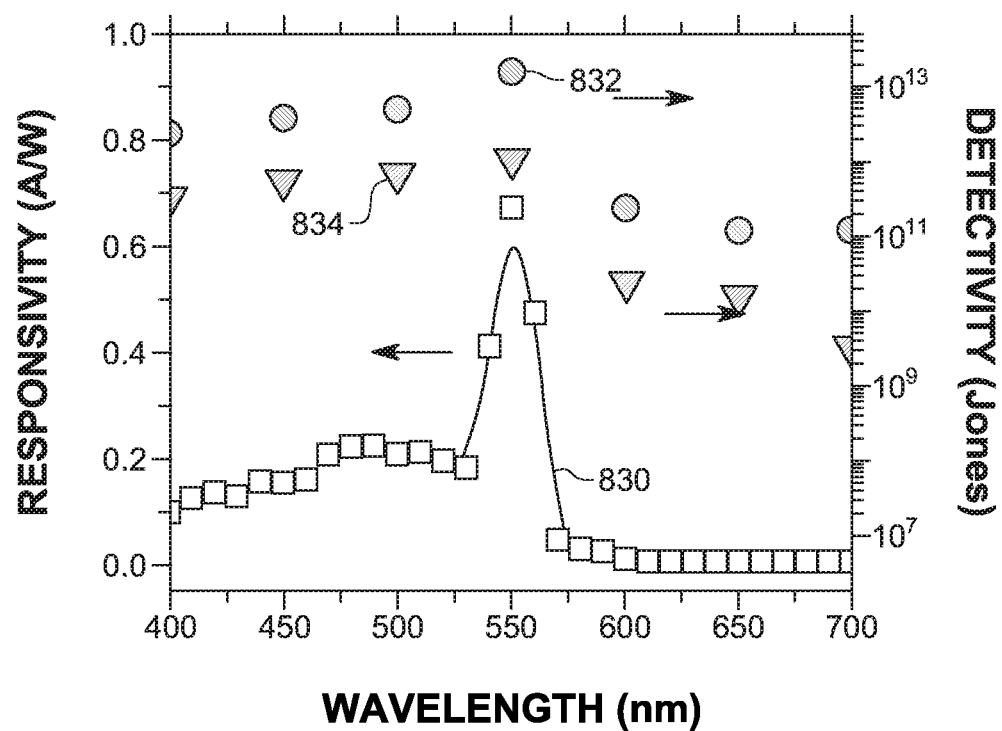
FIG. 8B illustrates the responsivity of the smooth- and rough-surface 2D hybrid perovskite materials.

The responsivity, which indicates how efficient a material responds to the optical signal, is calculated based on the following equation:

$$R = \frac{I_{ph}}{P_{light}}, \quad (1)$$

in which $I_{ph}$ is the photocurrent and $P_{light}$ is the power of the incident light. Based on this equation, the responsivity 830 of the smooth hybrid perovskite material 200 has been calculated as illustrated in FIG. 8B. The smooth hybrid perovskite material achieves the highest responsivity of 0.67 A $W^{-1}$ under the light intensity of 0.1 mW $cm^{-2}$ at 550 nm.

The detectivity (D*), which is another relevant parameter that indicates the ability of a material to detect a weak optical signal, is given by the following equation, $$D^* = \frac{R}{\sqrt{2qI_{dark}}}, \quad (2)$$

in which R is the responsivity, $I_{dark}$ is the dark current, and q is the elementary charge.

As previously mentioned, the smooth hybrid perovskite material 200 can significantly suppress the dark current. Thus, the detectivity can be largely enhanced as compared to that of the rough perovskite material 100. In this regard, FIG. 8B shows that the smooth hybrid perovskite material 200 achieves the highest value for D* 832, of about 2.6× 1013 Jones at 550 nm, which is 23.6 times higher than the detectivity 834 achieved by the rough hybrid perovskite material 100, which has a maximum value of 1.1×1012 Jones.

Figure 8C:
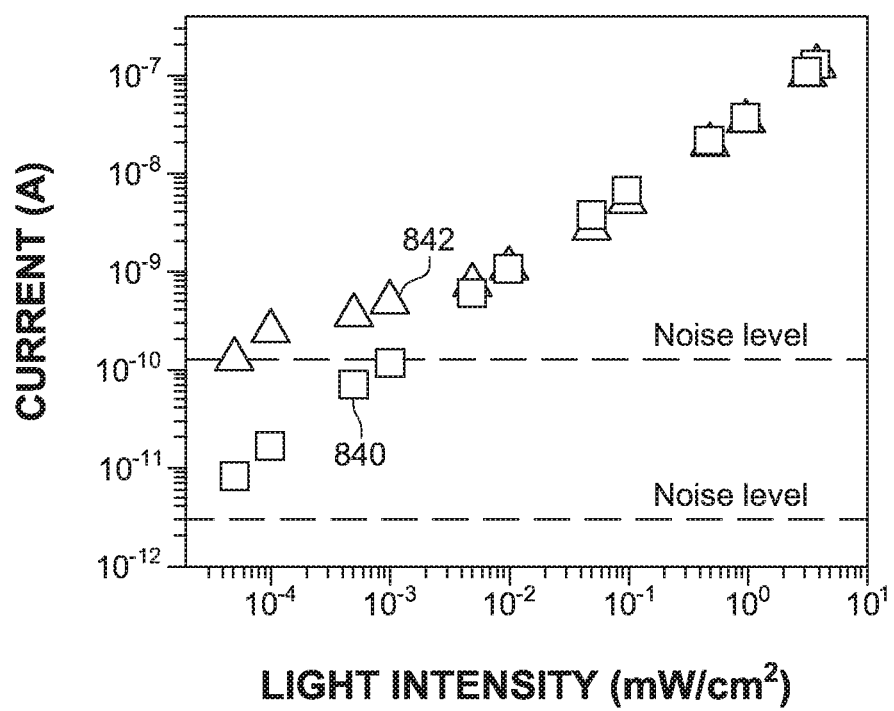
FIG. 8C illustrates the current versus light intensity of the smooth- and rough-surface 2D hybrid perovskite materials.

Besides responsivity and detectivity, the linear dynamic range (LDR) is another relevant parameter indicating the linear relationship between the photocurrent and incident light intensity and the LDR is given by the following equation:

$$LDR = 20\log(I_{ph}/I_{dark}), \quad (3)$$

where $I_{ph}$ is the photocurrent at a specific wavelength, and $I_{dark}$ is the dark current of the device. From FIG. 8C, it can be seen that the smooth perovskite material 200 has a LDR 840 of 82 dB, which is benefited by the significantly lower noise level due to the least moisture absorption. The higher LDR of the smooth hybrid perovskite material suggests that it has a linear response to the optical signal over a broader range of light intensity, which is desirable for the practical use of the hybrid perovskite material for a PD application.

Figure 8D:
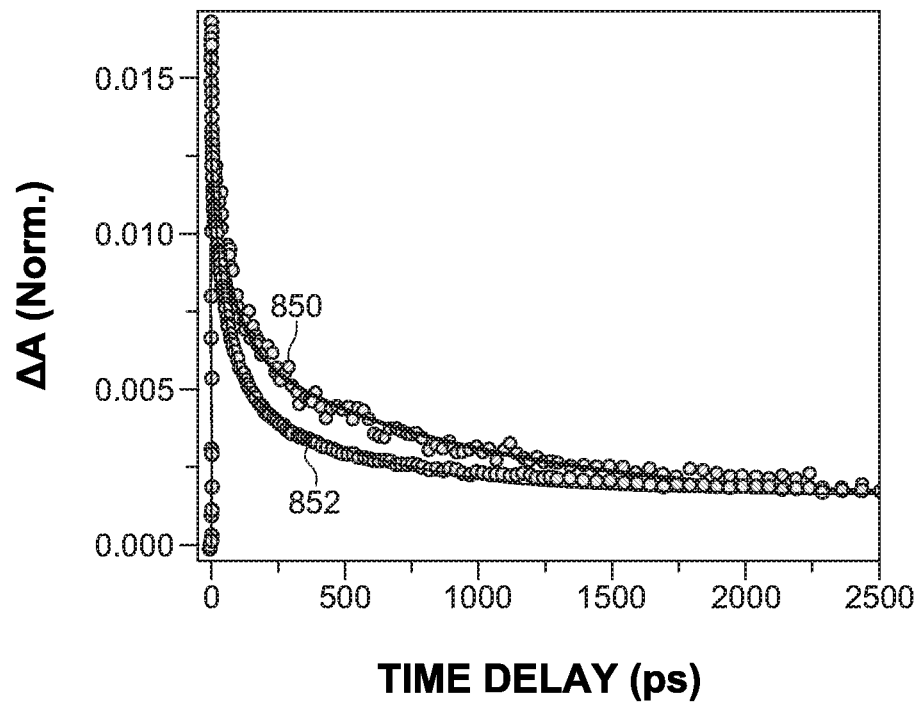
FIG. 8D illustrates the transient absorption spectra for the smooth- and rough-surface 2D hybrid perovskite materials.

Additionally, the carrier lifetime in both kinds of hybrid perovskite materials has been determined using femtosecond transient absorption (TA) spectroscopy. FIG. 8D displays the normalized TA decay kinetics probed at 535 nm after 475 nm excitation of the smooth and rough hybrid perovskite materials 200 and 100. Curve 850 shows the normalized TA decay for the smooth hybrid perovskite material 200 and curve 852 shows the normalized TA decay for the rough hybrid perovskite material 100. These curves indicate that the photoexcited carriers decay slower in the smooth hybrid perovskite material, implying its longer charge carrier recombination. Particularly, in the TA measurements, the single-photon absorption can only excite the carriers within 200 nm of the thickness under the surface of the hybrid perovskite crystals. Therefore, the discrepancy of the carrier lifetime is the result of the surface effect on the hybrid perovskite crystals. The longer carrier lifetime in the smooth hybrid perovskite material can be attributed to the largely reduced surface traps on the defect-free surface after exfoliation as compared to the rough surface of the hybrid perovskite material 100.

The above results regarding the surface morphology, photodetecting capability, and carrier lifetime of the hybrid perovskite materials reveal the impact of the surface condition onto the optoelectronic properties of a 2D layered hybrid perovskite material. These results indicate that the clean and smooth surface of the 2D hybrid perovskite material 200 can prevent the absorption of the ambient moisture and largely suppresses the dark current, which results in an improved detectivity and LDR of a hybrid perovskite PD device.

In addition to enhancing the moisture stability by improving the surface condition of the hybrid perovskite material 200 by smoothing the external organic layer, the layered hybrid perovskite material 200 in the device 400 utilize EA as the organic layer, which further improves the resistance to ambient moisture as compared to the commonly used organic linker PEA. When the photoresponsivities of the MSM devices made with EA and PEA are plotted against the wavelength, it is noted that the photoresponsivity of the EA perovskite material 200 is significantly higher than that of the PEA perovskite material over the entire range of the wavelength. This effect is attributed to the higher carrier mobility of the EA perovskite material due to the enhanced screening effect for charge impurities resulting from the high dielectric constant of the EA organic linker.

Figure 9:
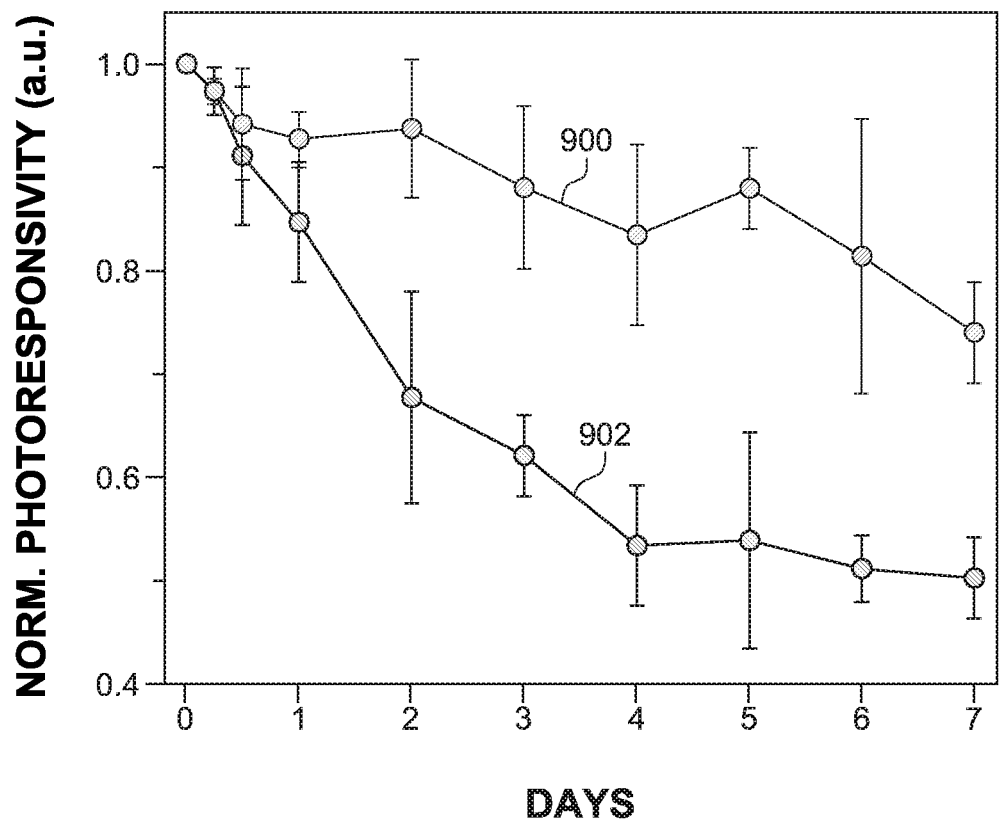
FIG. 9 illustrates the normalized photoresponsivity for the smooth- and rough-surface 2D hybrid perovskite materials.

FIG. 9 illustrates the normalized photoresponsivities against time of the MSM junction devices fabricated based on EA and PEA perovskite materials, respectively. It is noted that the responsivity 902 of the PEA perovskite device drops about 50% after 7 days, while the responsivity 900 of the EA perovskite device remains over 70% of the initial value after the same period of time. This reduced responsivity in both types of perovskites is believed to be due to the drop in the photocurrent. The drop in the photocurrent happens because the hydrated surface of the perovskite with increased roughness degrades the contact with the gold electrode and results in electrical current loss due to the higher resistance. In previous work by the inventors, it has been shown that the aged surface of the 2D PEA layered perovskite material becomes very rough and even porous, which can explain the degradation of the electrical contact and the reduction of the photocurrent over time.

The moisture resistance of the EA perovskite material is found to be much better than that of the PEA perovskite material as indicated in FIG. 9. In the AFM image of the EA perovskite surface scanned on days 0, 1, 2, and 4, despite the fact that the roughness of the EA perovskite increases with time, it still remains at about 23.44 nm. For the PEA perovskite, the RMS roughness increases from 1.68 nm on day 0 to 52.89 nm on day 4, which are evidenced by the AFM images.

Figure 10:
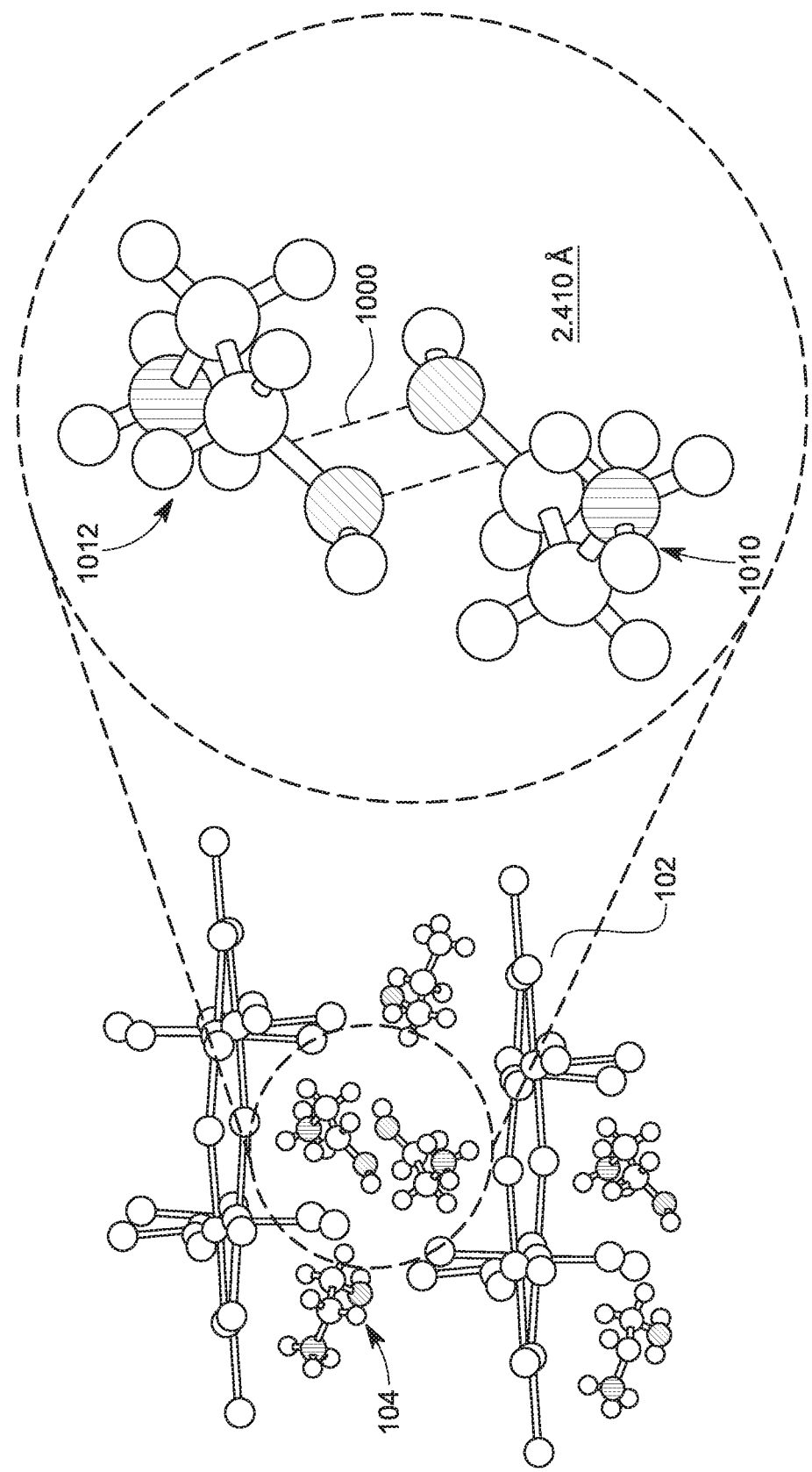
FIG. 10 illustrates the dipole-dipole interaction between the organic layers associated with the smooth-surface 2D hybrid perovskite material.

The improved moisture stability of the EA perovskite material 200 can be explained by the stronger Coulomb interactions between the organic elements 1010 and 1012 of the organic layer 104, i.e., dipole-dipole interaction 1000 as illustrated in FIG. 10, comparing to the weak Van der Waals force in the PEA perovskite material. As a result, the hydrophilic organic groups of the elements 1010 and 1012 can prevent the penetration of water and oxygen more effectively than other organic elements. The moisture stability of the EA perovskite material 200 has been further evidenced by the TA spectroscopy, which can measure the carrier lifetime of a material. The TA results for the EA and PEA perovskite materials indicate the longer carrier lifetime for the EA perovskite material 200.

It has been reported that when the surface of the perovskite SC is being hydrated, it will transform into a polycrystalline material and the carrier lifetime is shortened due to the increase of the recombination sites. The inventors have measured the carrier lifetime of the EA perovskite material by TA on days 0, 2, 6, and 21 and the results indicate that the carrier life time show little difference from day 0 to day 21. This finding suggests the good stability of the crystallinity and chemical composition of the EA perovskite material under ambient conditions. The above time-dependent studies including photoresponsivity, surface topology by AFM, and carrier lifetime measurements by TA unveil the improved moisture stability of the EA perovskite material over the traditional 2D perovskite materials with the common PEA organic layer.

Based on the above experiments, the inventors have concluded that the organic linker used in the 2D hybrid perovskite material 200 makes a contribution regarding the moisture stability. In addition, the smoothness of the external organic layer 202 of the 2D hybrid perovskite material 200 further enhances the optoelectronic properties of such materials. The embodiments discussed above reveal the strong dependence of the surface condition of the 2D hybrid perovskite crystals on their moisture stability and optoelectronic properties, which are advantageous for the design of practical optoelectronic devices based on hybrid perovskite crystals.

Figure 11:
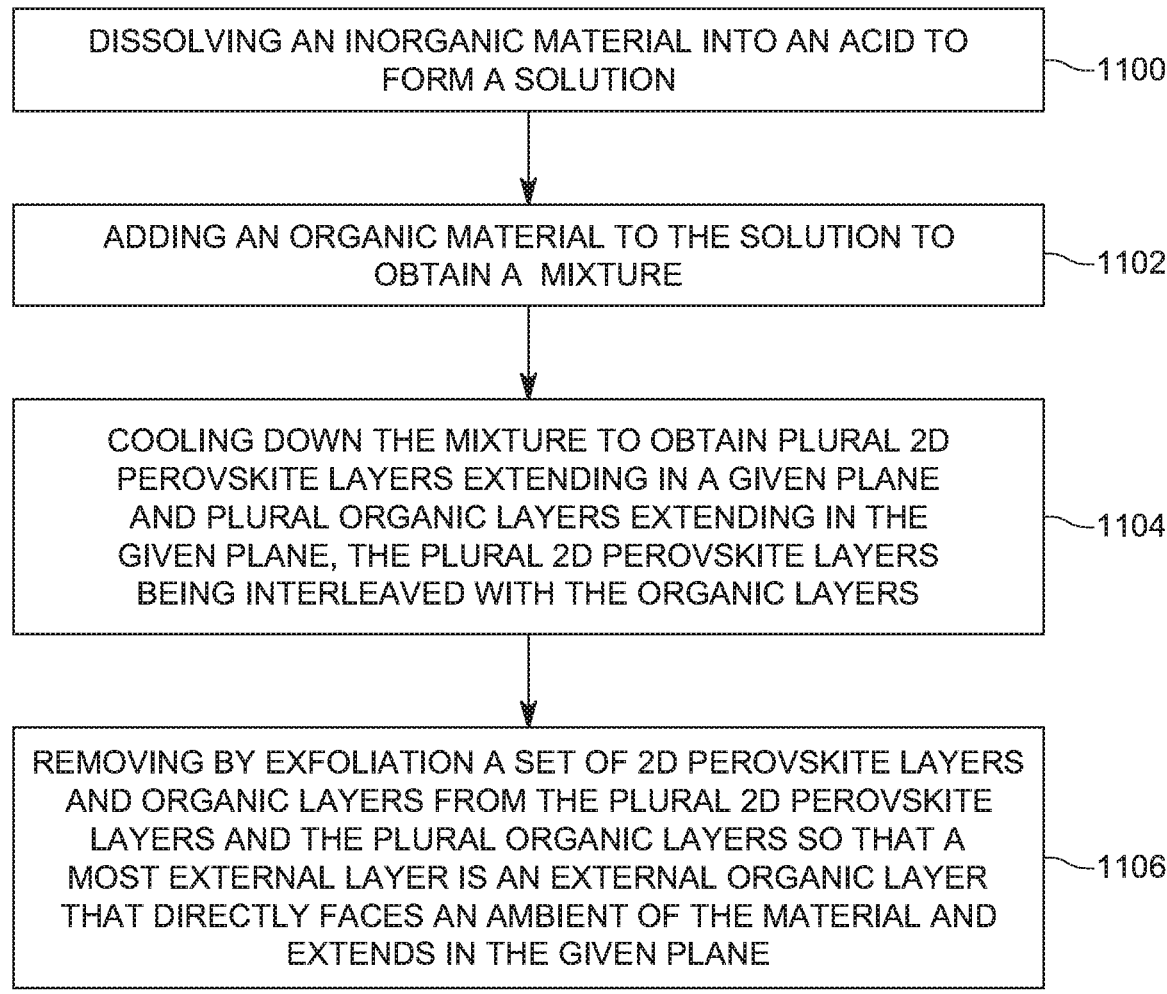
FIG. 11 is a flowchart of a method for making an opto-electronic device based on the smooth-surface 2D hybrid perovskite material.

According to an embodiment illustrated in FIG. 11, a method for making a two-dimensional (2D) hybrid perovskite based opto-electric device 400 includes a step 1100 of dissolving an inorganic material into an acid to form a solution, a step 102 of adding an organic material to the solution to obtain a mixture, a step 1104 of cooling down the mixture to obtain plural 2D perovskite layers 102-1, 102-2 extending in a given plane and plural organic layers 104 extending in the given plane, the plural 2D perovskite layers 102-1, 102-2 being interleaved with the organic layers 104, and a step 1106 of removing by exfoliation a set of 2D perovskite layers and organic layers from the plural 2D perovskite layers 102-1, 102-2 and the plural organic layers 104 so that a most external layer is an external organic layer 202 that directly faces an ambient of the material 200 and extends in the given plane. A roughness of the external organic layer 202 is smaller than 10 nm.

In one application, the roughness is smaller than 5 nm. In still another application, the roughness is smaller than 1 nm. The plural 2D perovskite layers include $PbI_4$ and the plural organic layers and the external organic layer each includes ethanolamine. The method may further include a step of forming electrical pads on the external organic layer to form an opto-electric device. The step of removing by exfoliation determines the given plane to be a (100) crystallographic plane of the perovskite material.

The disclosed embodiments provide a 2D hybrid perovskite based opto-electric device. The opto-electric device may be a solar cell, a light emitting diode, a transistor, a photodetector, etc. It should be understood that this description is not intended to limit the invention. On the contrary, the embodiments are intended to cover alternatives, modifications and equivalents, which are included in the spirit and scope of the invention as defined by the appended claims. Further, in the detailed description of the embodiments, numerous specific details are set forth in order to provide a comprehensive understanding of the claimed invention. However, one skilled in the art would understand that various embodiments may be practiced without such specific details.

Although the features and elements of the present embodiments are described in the embodiments in particular combinations, each feature or element can be used alone without the other features and elements of the embodiments or in various combinations with or without other features and elements disclosed herein.

This written description uses examples of the subject matter disclosed to enable any person skilled in the art to practice the same, including making and using any devices or systems and performing any incorporated methods. The patentable scope of the subject matter is defined by the claims, and may include other examples that occur to those skilled in the art. Such other examples are intended to be within the scope of the claims.

REFERENCES

[1] B. Turedi, K. J. Lee, I. Dursun, B. Alamer, Z. Wu, E. Alarousu, O. F. Mohammed, N. Cho, O. M. Bakr, *J. Phys. Chem. C* 2018, 122, 14128.
[2] C. Y. Chen, J. R. D. Retamal, I. W. Wu, D. H. Lien, M. W. Chen, Y. Ding, Y. L. Chueh, C. I. Wu, J. H. He, *ACS Nano* 2012, 6, 9366.
[3] A. Oranskaia, J. Yin, O. M. Bakr, J.-L. Bredas, O. F. Mohammed, *J. Phys. Chem. Lett.* 2018, 9, 5474.
[4] H. H. Tsai, W. Y. Nie, J. C. Blancon, C. C. S. Toumpos, R. Asadpour, B. Harutyunyan, A. J. Neukirch, R. Verduzco, J. J. Crochet, S. Tretiak, L. Pedesseau, J. Even, M. A. Alam, G. Gupta, J. Lou, P. M. Ajayan, M. J. Bedzyk, M. G. Kanatzidis, A. D. Mohite, *Nature* 2016, 536, 312.
[5] I. C. Smith, E. T. Hoke, D. Solis-Ibarra, M. D. McGehee, H. I. Karunadasa, *Angew. Chem., Int. Ed.* 2014, 53, 11232.
[6] M. Kollar, L. Ciric, J. H. Dil, A. Weber, S. Muff, H. M. Ronnow, B. Nafradi, B. P. Monnier, J. S. Luterbacher, L. Forro, E. Horvath, *Sci. Rep.* 2017, 7, 695.

What is claimed is:

1. A two-dimensional (2D) hybrid perovskite based opto-electric device comprising:
   first and second 2D perovskite layers extending along a given plane;
   an organic layer sandwiched between the first and second 2D perovskite layers, and extending along the given plane;
   an external organic layer formed on the first 2D perovskite layer and configured to directly face an ambient of the opto-electric device and to extend along the given plane; and
   electrical pads directly formed over the external organic layer,
   wherein a roughness of the external organic layer is smaller than 10 nm.

2. The device of claim 1, wherein the roughness is smaller than 5 nm.

3. The device of claim 1, wherein the roughness is smaller than 1 nm.

4. The device of claim 1, wherein the first and second 2D perovskite layers include $PbI_4$.

5. The device of claim 4, wherein the organic layer and the external organic layer each includes ethanolamine.

6. The device of claim 1, further comprising:
   an electrode which acts as a gate,
   wherein a first pad of the electrical pads acts as a source and a second pad of the electrical pads acts as a drain.

7. The device of claim 1, wherein the given plane corresponds to a crystallographic plane of the perovskite material.

8. A two-dimensional (2D) hybrid perovskite material comprising:
   a first 2D perovskite layer extending along a given plane;
   an organic layer extending along the first 2D perovskite layer;
   a second 2D perovskite layer extending along the organic layer so that the organic layer is sandwiched between the first and second 2D perovskite layers; and
   an external organic layer extending along the first 2D perovskite layer so that the external organic layer directly faces an ambient,
   wherein a roughness of the external organic layer is smaller than 10 nm.

9. The material of claim 8, wherein the roughness is smaller than 5 nm.

10. The material of claim 8, wherein the roughness is smaller than 1 nm.

11. The material of claim 8, wherein the first and second 2D perovskite layers include $PbI_4$.

12. The material of claim 11, wherein the organic layer and the external organic layer each includes ethanolamine.

13. The material of claim 8, wherein the given plane corresponds to a crystallographic plane of the perovskite material.

14. A method for making a two-dimensional (2D) hybrid perovskite based opto-electric device, the method comprising:
   dissolving an inorganic material into an acid to form a solution;
   adding an organic material to the solution to obtain a mixture;
   cooling down the mixture to obtain plural 2D perovskite layers extending along a given plane and plural organic layers extending along the given plane, the plural 2D perovskite layers being interleaved with the organic layers; and removing by exfoliation a set of 2D perovskite layers and organic layers from the plural 2D perovskite layers and the plural organic layers so that a most external layer is an external organic layer that directly faces an ambient of the material and extends along the given plane, wherein a roughness of the external organic layer is smaller than 10 nm.

15. The method of claim 14, wherein the roughness is smaller than 5 nm.

16. The method of claim 14, wherein the roughness is smaller than 1 nm.

17. The method of claim 14, wherein the plural 2D perovskite layers include $PbI_4$.

18. The method of claim 17, wherein the plural organic layers and the external organic layer each includes ethanolamine.

19. The method of claim 14, further comprising:
forming electrical pads on the external organic layer to form an opto-electric device.

20. The method of claim 14, wherein the given plane corresponds to a crystallographic plane of the perovskite material.

* * * * *